(12) United States Patent
Ariyoshi

(10) Patent No.: US 7,253,624 B2
(45) Date of Patent: Aug. 7, 2007

(54) MAGNET SYSTEM AND MAGNETIC RESONANCE IMAGING SYSTEM UTILIZING THE MAGNET SYSTEM

(75) Inventor: Akihiko Ariyoshi, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 11/315,002

(22) Filed: Dec. 23, 2005

(65) Prior Publication Data

US 2006/0261812 A1   Nov. 23, 2006

(30) Foreign Application Priority Data

May 17, 2005   (JP) .............................. 2005-144163

(51) Int. Cl.
*G01V 3/00* (2006.01)
(52) U.S. Cl. ...................................... 324/320; 324/319
(58) Field of Classification Search ...................... None
See application file for complete search history.

(56) References Cited

U.S. PATENT DOCUMENTS

| | | | |
|---|---|---|---|
| 5,550,472 A * | 8/1996 | Richard et al. ............. | 324/320 |
| 5,635,839 A * | 6/1997 | Srivastava et al. .......... | 324/320 |
| 6,154,110 A * | 11/2000 | Takeshima ................... | 335/299 |
| 6,707,359 B2 | 3/2004 | Yoshida et al. | |
| 6,847,279 B2 | 1/2005 | Yoshida et al. | |
| 6,861,933 B1 | 3/2005 | Yoshida et al. | |
| 2003/0011456 A1 * | 1/2003 | Yoshida et al. ............. | 335/299 |
| 2004/0051613 A1 * | 3/2004 | Yoshida et al. ............. | 335/299 |
| 2005/0162167 A1 * | 7/2005 | Heid et al. ................... | 324/318 |
| 2006/0262826 A1 * | 11/2006 | Dietz et al. ................... | 372/96 |
| 2007/0030004 A1 * | 2/2007 | Amor et al. ................. | 324/318 |

FOREIGN PATENT DOCUMENTS

JP   2002-336215 A   11/2002

* cited by examiner

*Primary Examiner*—Brij Shrivastav
*Assistant Examiner*—Tiffany A. Fetzner
(74) *Attorney, Agent, or Firm*—Buchanan Ingersoll & Rooney PC

(57) ABSTRACT

In a magnet system utilizing a pair of magnet bodies each having a cylindrical hollow, by effectively utilizing the hollow spaces of the magnet bodies, the ability of adjusting through magnetic shims the magnetic-field homogeneity of a homogeneous static-magnetic-field space region is enhanced. Two magnet bodies each incorporating a group of superconductive coils and each having a cylindrical hollow are arranged opposing each other; the first ring-shaped magnetic shim is arranged in the cylindrical hollow of the one magnet body, concentrically with the first group of superconductive coils; and the second ring-shaped magnetic shim is arranged inside the first ring-shaped magnetic shim, concentrically with the first group of superconductive coils. Moreover, the third ring-shaped magnetic shim is arranged in the cylindrical hollow of the other magnet body, concentrically with the second group of superconductive coils, and arranged opposing the first ring-shaped magnetic shim; and the fourth ring-shaped magnetic shim is arranged inside the third ring-shaped magnetic shim, concentrically with the second group of superconductive coils, and arranged opposing the second ring-shaped magnetic shim.

8 Claims, 6 Drawing Sheets

MAGNET SYSTEM AND MAGNETIC RESONANCE IMAGING SYSTEM UTILIZING THE MAGNET SYSTEM

BACKGROUND OF THE INVENTION

1. Field of the Invention

The present invention belongs to a technological field related to magnetic resonance imaging systems utilized for in-vivo imaging diagnosis, and relates to magnet systems utilized in magnetic resonance imaging systems. In particular, the present invention relates to enhancement of magnetic-field homogeneity in a homogeneous static-magnetic-field space region generated by a magnet system.

2. Description of the Related Art

Magnetic resonance imaging systems are roughly categorized in accordance with the shape of a magnet system into a cylindrical type and a facing type; in recent years, the facing type has become dominant. Facing-type magnetic resonance imaging systems form a sphere-shaped homogeneous static-magnetic-field space region between a pair of magnet bodies, and are superior to cylindrical-type systems in terms of the subject's feeling of not being confined and convenience for diagnosis-related staffs to walk around during a diagnosis. The strength of the magnetic field of a homogeneous static-magnetic-field space region in a facing-type magnetic resonance imaging system is 0.2 to 1.0 tesla, and a tolerance within a virtual sphere is normally several ppm. In addition, the size of a facing-type magnetic resonance imaging system is, for example, approximately 2 to 3 m in height and, in a plan view, approximately 2 m in maximal diameter. The weight of a facing-type magnetic resonance imaging system depends on the method of shielding magnetic field; for example, in the case where no magnet body is utilized, the weight is approximately 10 t.

In facing-type magnetic resonance imaging systems as described above, it is important to secure the magnetic-field homogeneity of a homogeneous static-magnetic-field space region, while enhancing downsizing and weight saving of the system. In conventional magnet systems, strip-shaped ferromagnetic shims have been arranged on respective facing sides of a pair of magnet bodies each having a cylindrical hollow, and ring-shaped ferromagnetic shims have been arranged on both the facing sides and on the surfaces of the hollow portions, of the magnet bodies (e.g., Japanese Laid-Open Patent Publication No. 2002-336215).

SUMMARY OF THE INVENTION

However, in the conventional magnet systems, magnetic shims have not been arranged in the hollow spaces of the magnet bodies, whereby the hollow spaces that are in the vicinity of a homogeneous static-magnetic-field space region have not effectively been utilized; therefore, there has been a problem in that adjusting ability for the magnetic-field homogeneity of the homogeneous static-magnetic-field space region is relatively low.

The present invention has been implemented to solve the forgoing problem; it is an object that, in a magnet system utilizing a pair of magnet bodies each having a cylindrical hollow, by effectively utilizing the hollow spaces of the magnet bodies, thereby enhancing the ability of adjusting through magnetic shims the magnetic-field homogeneity of a homogeneous static-magnetic-field space region, the magnetic-field homogeneity of a homogeneous static-magnetic-field space region created by the magnet system is raised.

The present invention provides a magnet system including a first magnet body, having a first cylindrical hollow, in which a first group of superconductive coils are incorporated, a second magnet body, having a second cylindrical hollow and being arranged opposing the first magnet body, in which a second group of superconductive coils are incorporated, and magnetic shims for adjusting magnetic-field homogeneity of a homogeneous static-magnetic-field space region formed between the first magnet body and the second magnet body; in the magnet system, a first ring-shaped magnetic shim is arranged in the first cylindrical hollow of the first magnet body, concentrically with the first group of superconductive coils, a second ring-shaped magnetic shim is arranged inside the first ring-shaped magnetic shim, concentrically with the first group of superconductive coils, a third ring-shaped magnetic shim is arranged in the second cylindrical hollow of the second magnet body, concentrically with the second group of superconductive coils, and arranged opposing the first ring-shaped magnetic shim, and a fourth ring-shaped magnetic shim is arranged inside the third ring-shaped magnetic shim, concentrically with the second group of superconductive coils, and arranged opposing the second ring-shaped magnetic shim.

According to the present invention, in a magnet system utilizing a pair of magnet bodies each having a cylindrical hollow, by effectively utilizing the hollow spaces of the magnet bodies, thereby enhancing the ability of adjusting through magnetic shims the magnetic-field homogeneity of a homogeneous static-magnetic-field space region, the magnetic-field homogeneity of a homogeneous static-magnetic-field space region created by the magnet system can be raised.

DETAILED DESCRIPTION OF THE PREFERRED EMBODIMENTS

Embodiment 1

Figure 1:
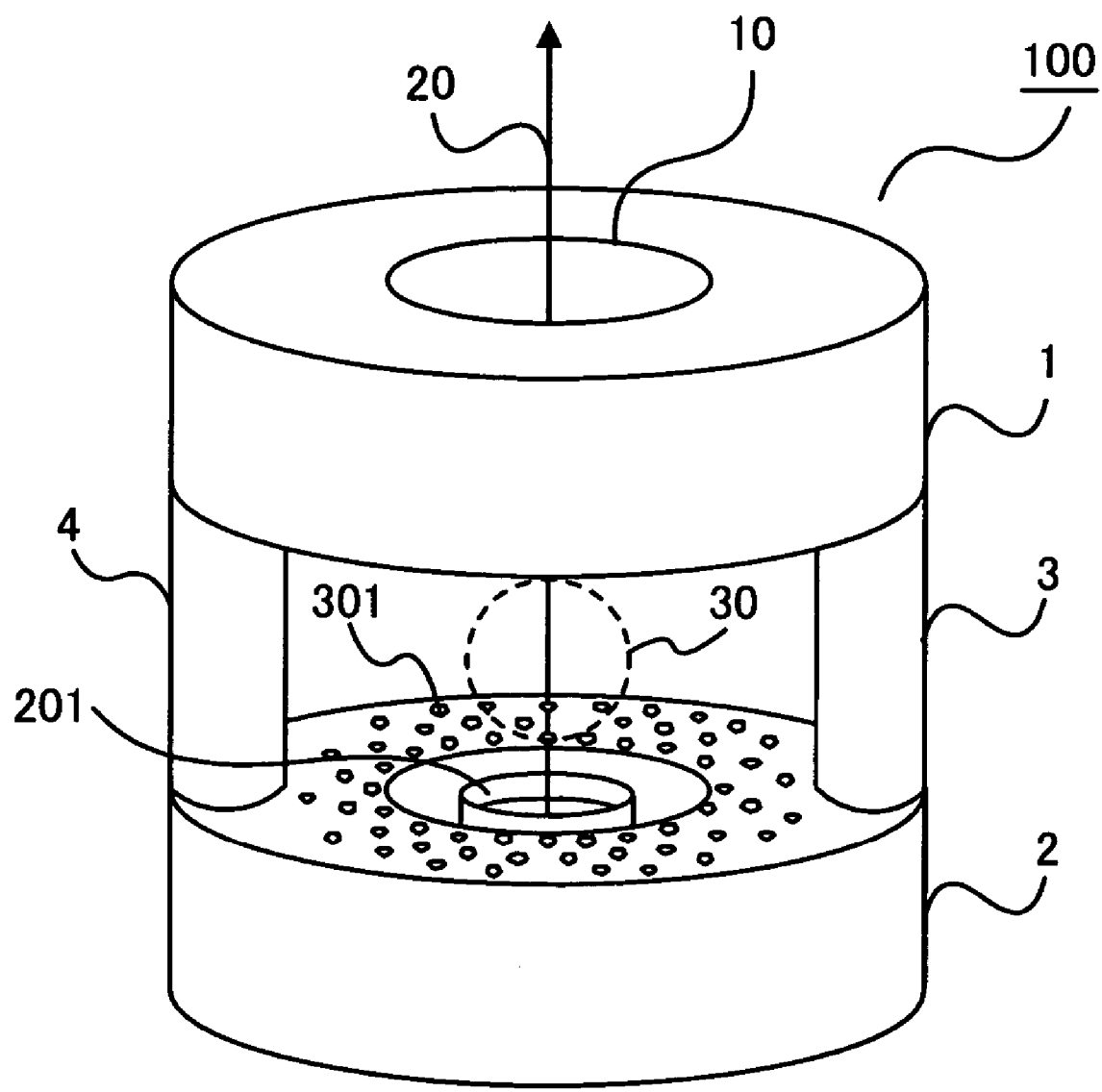
FIG. 1 is a perspective view illustrating a configuration of a magnet system according to Embodiment 1.
Figure 2:
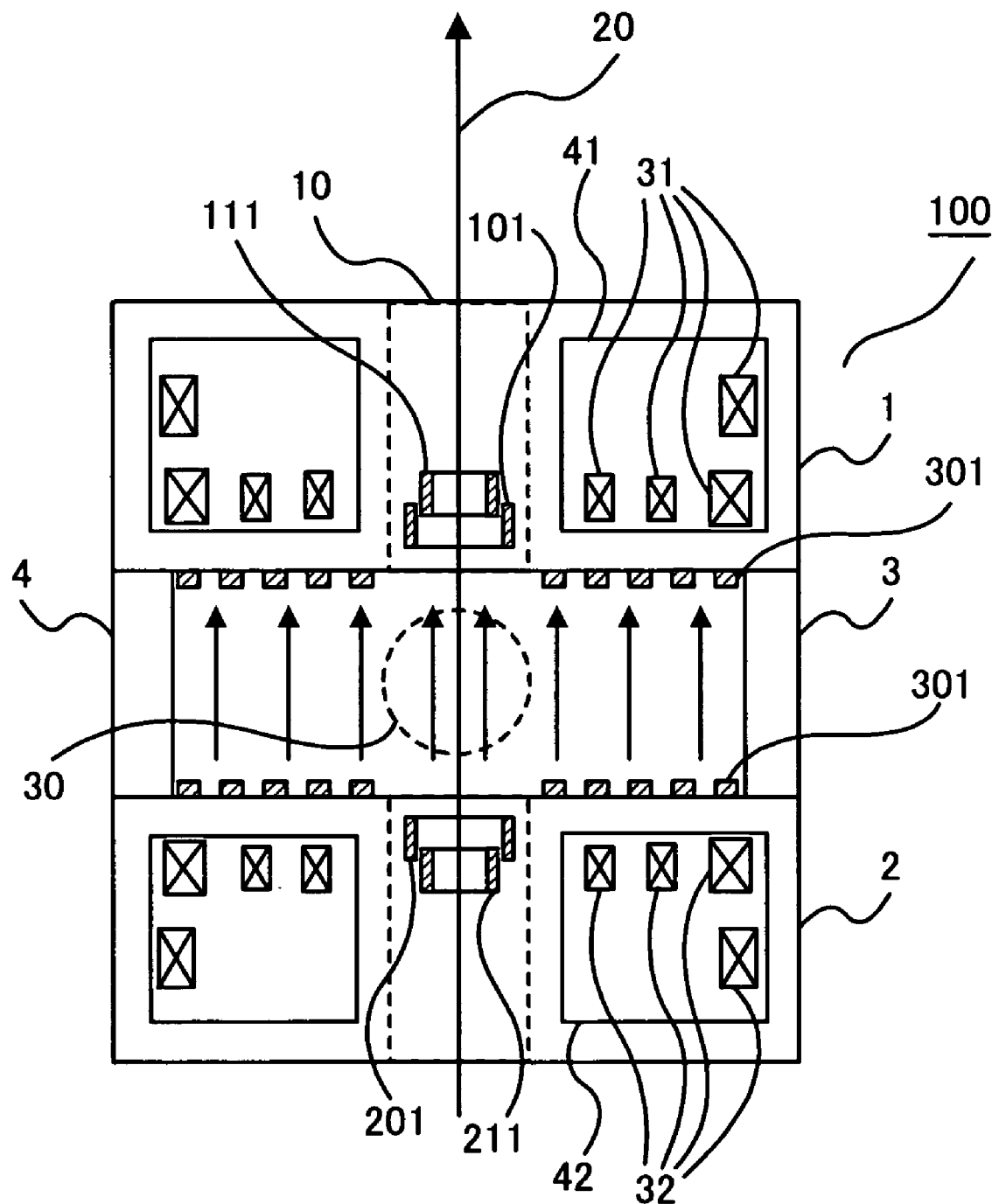
FIG. 2 is a longitudinal cross-sectional view of the magnet system in FIG. 1.
Figure 3:
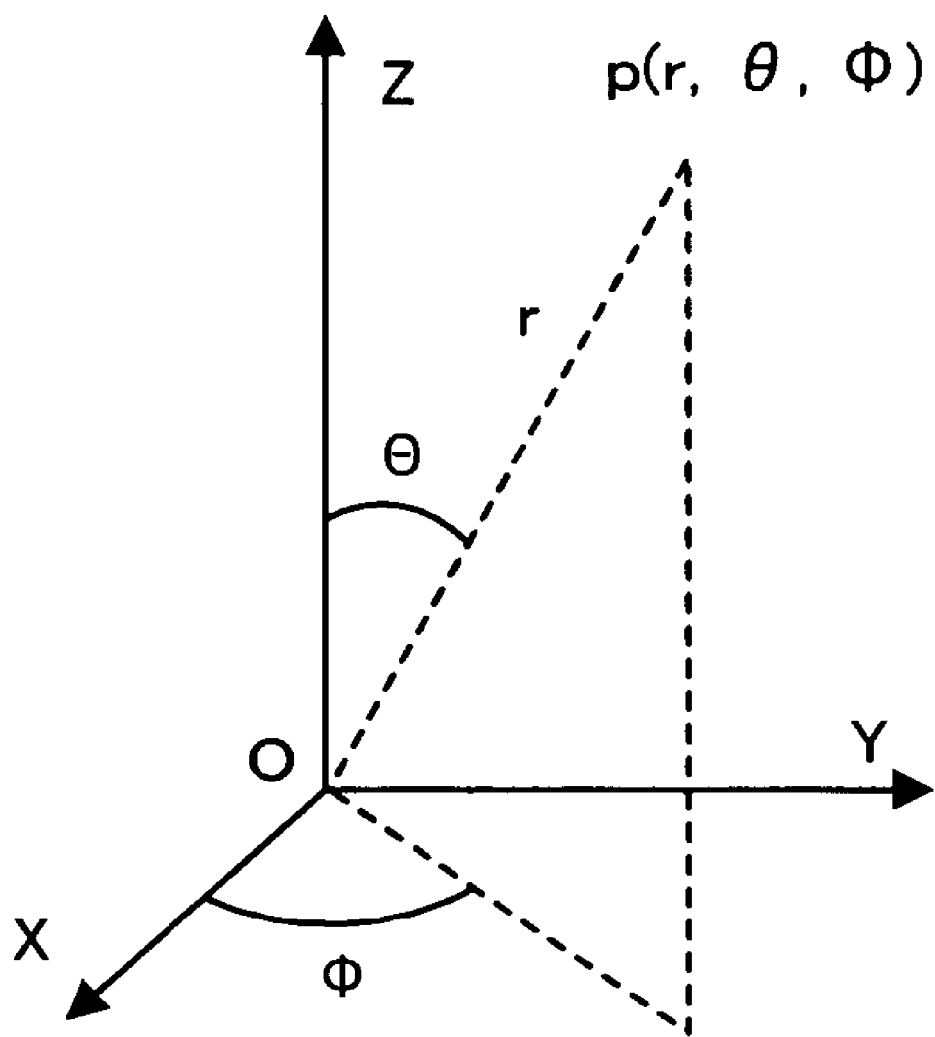
FIG. 3 is a chart representing a polar coordinate system given by Equation (1)
Figure 4:
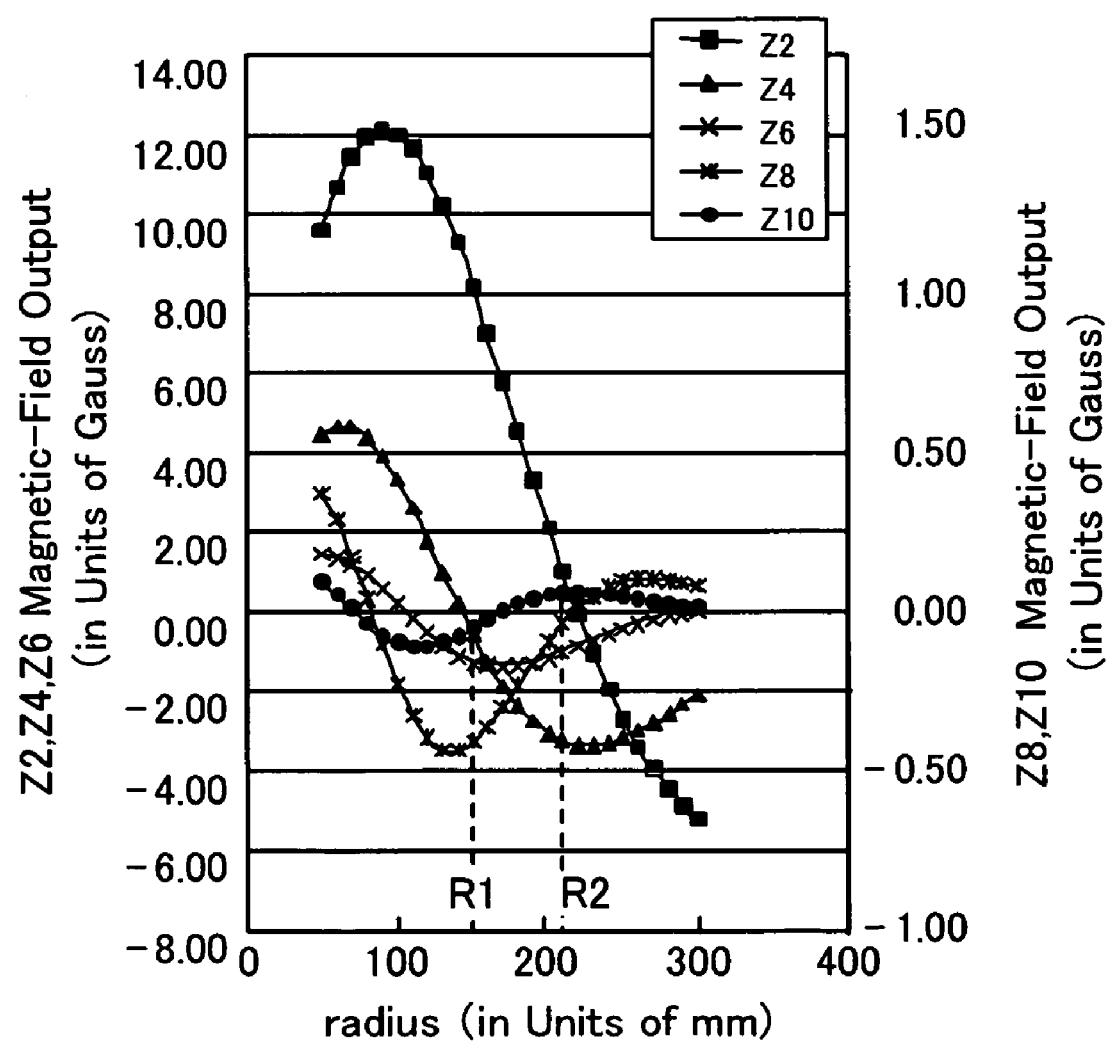
FIG. 4 is a characteristic graph representing distribution of Z-direction even order components created by a ring-shaped magnetic shim according to Embodiment 1.

Embodiment 1 of the present invention will be explained with reference to FIGS. 1 to 4. FIG. 1 is a perspective view illustrating a configuration of a magnet system utilized in a facing-type magnetic resonance imaging system; FIG. 2 is a longitudinal cross-sectional view of the magnet system in FIG. 1 FIG. 3 is a chart representing a polar coordinate system; and FIG. 4 is a characteristic graph representing distribution of magnetic-flux-direction even order components of a magnetic field created by a ring-shaped magnetic shim. In addition, the same reference marks in each Figure indicate the same or equivalent constituent elements.

In FIG. 1, a magnet system 100 has a first magnet body 1 and a second magnet body 2; the first magnet body 1 and the second magnet body 2 are arranged facing each other. The circumference portions of the first magnet body 1 and the second magnet body 2 are coupled with each other through coupling columns 3 and 4. The first magnet body 1 incorporates circular first superconductive coils 31 and has a cylindrical hollow 10. The second magnet body 2 incorporates circular second superconductive coils 32 and has the cylindrical hollow 10. In FIG. 1, as the cylindrical hollow 10, a through-hole is illustrated; however, a recess may be employed.

The first group of superconductive coils 31 and the second group of superconductive coils 32 form a homogeneous static-magnetic-field space region 30 between the first magnet body 1 and the second magnet body 2. The magnetic-field homogeneity of the homogeneous static-magnetic-field space region 30 is adjusted by means of magnetic shims 301 that are arranged on the respective facing sides of the first magnet body 1 and the second magnet body 2.

A first ring-shaped magnetic shim 101 and a second ring-shaped magnetic shim 111 are arranged in the cylindrical hollow 10 of the first magnet body 1. The first ring-shaped magnetic shim 101 and the second ring-shaped magnetic shim 111 are concentric with the first group of superconductive coils 31; the second ring-shaped magnetic shim 111 is inside the first ring-shaped magnetic shim 101. In this situation, the first and second ring-shaped magnetic shims 101 and 111 are fixed on the inner wall of the cylindrical hollow 10, being supported through supporting materials that are non-magnetic and position-adjustable.

A third ring-shaped magnetic shim 201 and a forth ring-shaped magnetic shim 211 are arranged in the cylindrical hollow 10 of the second magnet body 2. The third ring-shaped magnetic shim 201 and the forth ring-shaped magnetic shim 211 are concentric with the second group of superconductive coils 32; the forth ring-shaped magnetic shim 211 is inside the third ring-shaped magnetic shim 201. In this situation, the first and third ring-shaped magnetic shims 101 and 201 are arranged facing each other; the second and fourth ring-shaped magnetic shims 111 and 211 are arranged facing each other.

The configuration of the magnet system 100 will be explained in detail below. In the first magnet body 1, as is well known, a refrigerant container 41 is arranged in a vacuum container formed of non-magnetic metal such as aluminum or stainless steel. An unillustrated heat shield is arranged between the refrigerant container 41 and the vacuum container. The first group of superconductive coils 31 are incorporated in the refrigerant container 41. The second magnet body 2 is configured symmetrically with the first magnet body 1; a refrigerant container 42 is arranged in a vacuum container; and a heat shield is arranged between the refrigerant container 42 and the vacuum container. The second group of superconductive coils 32 are incorporated in the refrigerant container 42. The first and the second groups of superconductive coils 31 and 32 are concentrically arranged in such a way as to share the same center axis 20.

In addition, the refrigerant container 41 of the first magnet body 1 and the refrigerant container 42 of the second magnet body 2 communicate with each other, through a refrigerant communication tube provided in at least one of the coupling columns 3 and 4. In the case where liquefied helium is utilized as a refrigerant, when a refrigerant is supplied to the refrigerant container 41 illustrated on the upper side in FIG. 2, the refrigerant, due to its own weight, flows into the refrigerant container 42 by way of the refrigerant communication tube.

The sphere-shaped homogeneous static-magnetic-field space region 30 that is necessary for imaging diagnosis of a subject exists in the center vicinity of the space between the facing sides of the first and second magnet bodies 1 and 2. The first and second magnet bodies 1 and 2 create in and in the vicinity of the homogeneous static-magnetic-field space region 30 a magnetic field whose magnetic-flux direction is in parallel with the center axis 20. In this situation, the computation of the magnetic field created by the first and second magnet bodies 1 and 2 will be explained. In general, by utilizing Legendre functional expansion, the strength of a magnetic field in the homogeneous static-magnetic-field space region 30 is given by Equation (1). Variables r, θ, and φ in Equation (1) are represented in FIG. 3. In addition, a magnetic-flux direction that is in parallel with the center axis 20 is termed "Z direction".

$$B_z(\gamma, \theta, \phi) = \sum_{n=0}^{\infty} \sum_{m=0}^{n} \gamma^n P_n^m(\cos\theta) \quad (1)$$

$$\{a_n^m \cos(m\phi) + b_n^m \sin(m\phi)\}$$

where a $\bar{a}_n^m$ and b $\bar{b}_n^m$ are coefficients for respective components.

A magnetic field is termed by means of "component", in accordance with (m, n) values in the Legendre functional expansion. The (0, 0) component is the necessary homogeneous magnetic-field component; others are all non-homogeneous, erroneous magnetic-field components in the homogeneous static-magnetic-field space region 30. Among the erroneous magnetic-field components, components in the case where m is zero, i.e., (0, n) components are termed "Z component" (components along the center axis 20); components in the case where m is not zero are termed "R component". In general, it is more difficult to correct erroneous magnetic-field components having high-order n (high-order components) than to correct erroneous magnetic-field components having low-order n (low-order components).

The magnet system 100 utilized in a facing-type magnetic resonance imaging system is approximately 1.8 to 2.5 m in diameter. In order to secure, for a space where a diagnosis subject of a magnetic resonance imaging system is placed, a distance of 400 mm to 500 mm between the facing sides, the distance between the facing sides of the first and second magnet bodies should be approximately 1.5 times (600 to 700 mm) as long as that distance. In Embodiment 1, as the homogeneous static-magnetic-field space region 30, a virtual sphere having a diameter of approximately 400 mm is set up, and the radius of the cylindrical hollow 10 is set to approximately 300 mm.

In order to design the magnet system 100, in the first place, respective numbers of the first and the second group of superconductive coils 31 and 32 are set. In the second place, the size, the location, the number of winding turns, the current density, and the like, of each superconductive coil are strictly set in such a way that all erroneous magnetic-field components are approximately zero in the homogeneous static-magnetic-field space region 30 created by the first and the second group of superconductive coils 31 and 32. In general, in the case of a magnetic resonance imaging system, if the size or location of a superconductive coil deviates by one mm, the magnetic-field homogeneity is affected by approximately several tens ppm.

As discussed above, strict optimization is implemented so that all erroneous magnetic-field components become approximately zero; however, it is ordinary that, when the produced magnet system 100 is actually excited, the magnetic-field homogeneity deteriorates to several hundreds ppm or worse. This is why, in a step of producing the magnet system 100, the magnetic-field homogeneity is deteriorated, for example, due to dimensional tolerances of the superconductive coils and a little magnetism in utilized materials. In particular, in a top-and-bottom split type magnetic resonance imaging system, the magnetic-field homogeneity is more likely to deteriorate than in a cylindrical-solenoid type magnetic resonance imaging system, owing to addition of the positional error between the first magnet body 1 and the second magnet body 2 that are situated one above the other. The positional error is caused mainly by positional deviation in an assembling step, or distortion due to welding, of the magnet body.

To date, strip-shaped magnetic shims have been utilized, in order to correct the magnetic-field homogeneity that has deteriorated to the same as or worse than several hundreds ppm. In FIG. 1, the magnetic shims 301 are disposed on the respective surfaces, of the first and second magnet bodies 1 and 2, facing the homogeneous static-magnetic-field space region 30. When magnetic shims 301 are mounted only on the surface of either one of the first and second magnet bodies 1 and 2, magnetic-field components having odd-number n, among Z components having (0, n), are produced. In contrast, when the same amount of shim are mounted in the same position of the first and second magnet bodies 1 and 2, magnetic-field components having even-number n are produced.

In this situation, on the first and second magnet bodies 1 and 2, respective tabular shim-mounting materials are provided in which a great number of shim-mounting holes are arranged. Into necessary shim-mounting holes among these shim-mounting holes, magnetic shims 301 formed of a soft-magnetic material (such as iron, a silicon steel sheet, or permalloy) are attachably and detachably screwed. On this occasion, effects of the installation environment for the magnetic resonance imaging system can be corrected.

As described above, by adjusting the positions and the number of the magnetic shims 301 arranged in the first and second magnet bodies 1 and 2, the magnetic-field homogeneity is raised to several ppm that is a tolerance value. In general, the magnetic shims 301 are arranged in such a way that, after analyzing in detail the magnetic moment, of each magnetic shim, that differs depending on the position thereof, and magnetic-field components, in the homogeneous static-magnetic-field space region 30, that are created by the magnetic moment, by, based on the results of analyzing erroneous magnetic-field components in the case of the magnetic-field homogeneity of several hundreds ppm, setting a compensation amount for each erroneous magnetic-field component, the respective positions and numbers are optimized.

Moreover, in Embodiment 1, the first and second ring-shaped magnetic shims 101 and 111 are arranged in the cylindrical hollow 10 of the first magnet body 1; the third and fourth ring-shaped magnetic shims 201 and 211 are arranged in the cylindrical hollow 10 of the second magnet body 2. By making the magnetic shims ring-shaped and arranging them concentrically with the superconductive coils, the occurrence of "m≠0 components" is suppressed.

FIG. 3 is a characteristic graph representing distribution of Z-direction even order components created by a ring-shaped magnetic shim; Here, a case is exemplified where ring-shaped metal magnetic shims having a height of 5 mm are arranged in the respective cylindrical hollows 10 of the first and second magnet bodies 1 and 2. The radial distance (in units of mm) from the center axis of the first and second magnet bodies 1 and 2 is along the abscissa, and the magnetic-field output (in units of Gauss) is along the ordinate. FIG. 4 represents the relationship between the radius of the ring-shaped magnetic shim and the magnetic-field output of each of even order components from (0, 2) component to (0, 10) component, i.e., a Z-direction second order component to a Z-direction tenth order component.

As can be seen from FIG. 4, in a domain where the radius of the ring-shaped magnetic shims is small, the magnetic-field output of each Z-direction even order component is large, and is likely to take a positive value. It can also be seen that, in a domain where the radius of the ring-shaped magnetic shims is large, the magnetic-field output of each Z-direction even order component is small, and is likely to take a negative or a close-to-zero value. In addition, the distribution of the magnetic-field outputs represented in FIG. 4 changes depending on the first and the second group of superconductive coils 31 and 32; therefore, strictly speaking, the correction of the magnetic-field output should be implemented in accordance with the actual design.

Meanwhile, the cylindrical hollows 10 of the first and second magnet bodies 1 and 2 correspond to a domain where the radius of the ring-shaped magnetic shim is small. By arranging ring-shaped magnetic shims in the cylindrical hollows 10, Z-direction even order components having positive values and large magnetic-field outputs are readily obtained. As described above, by effectively utilizing the cylindrical hollow 10 that is approximately a homogeneous static-magnetic-field region to obtain a large magnetic-field output, the ability of adjusting magnetic-field homogeneity of the homogeneous static-magnetic-field space region 30 is enhanced, whereby the magnetic-field homogeneity of the homogeneous static-magnetic-field space region 30 created by the magnet system 100 can be raised.

Moreover, if a large magnetic-field output can be obtained through the ring-shaped magnetic shim, part of the output of the superconductive coil can be compensated; therefore, the magnetomotive force for the first and the second group of superconductive coils 31 and 32 can significantly be reduced. By appropriately selecting the radius and the height of the ring-shaped magnetic shim, provision is made for changing the arrangement and the number of winding turns, of the superconductive coil, and for making the superconductive coil have a shape that is efficient for production. Accordingly, a magnet system whose production cost is low can be designed.

Embodiment 2

Embodiment 2 is a variant example in which the arrangement of the ring-shaped magnetic shims, in Embodiment 1, is changed, and a Z-direction tenth order component is compensated through the ring-shaped magnetic shims. As described above, in general, the correction of a high-order component is more difficult than that of a low-order component. In particular, it is difficult to implement a final correction for the Z-direction tenth order component created by superconductive coils. However, if the designing is implemented in such a way as to preliminarily limit the output of the Z-direction tenth order component, the number of the superconductive coils and the magnetomotive force for the magnet systems are likely to increase.

Meanwhile, as can be seen from the tendency of the magnetic-field outputs, represented in FIG. 4, of the ring-shaped magnetic shims, there is a radius at which the polarity (positive or negative) of the magnetic-field output of the Z-direction tenth order component changes. Thus, in Embodiment 2, the radiuses of the first and third ring-shaped magnetic shims 101 and 201 are designated by R2 in FIG. 4; the radiuses of the second and fourth ring-shaped magnetic shims 111 and 211 are designated by R2 in FIG. 4. In this situation, the magnetic-field outputs of the first and third ring-shaped magnetic shims 101 and 201 are positive, and the magnetic-field outputs of the second and fourth ring-shaped magnetic shims 111 and 211 are negative.

As described above, by making a reverse relationship between the polarities of the Z-direction tenth order components created by the first and third ring-shaped magnetic shims 101 and 201 and the polarities of the Z-direction tenth order components created by the second and fourth ring-shaped magnetic shims 111 and 211, the Z-direction tenth order component can readily be compensated. Accordingly, without increasing the number of superconductive coils or the magnetomotive force for the magnet system 100, the magnetic-field homogeneity, especially with regard to the Z-direction tenth order component, of the homogeneous static-magnetic-field space region 30 can be enhanced.

Embodiment 3

Figure 5:
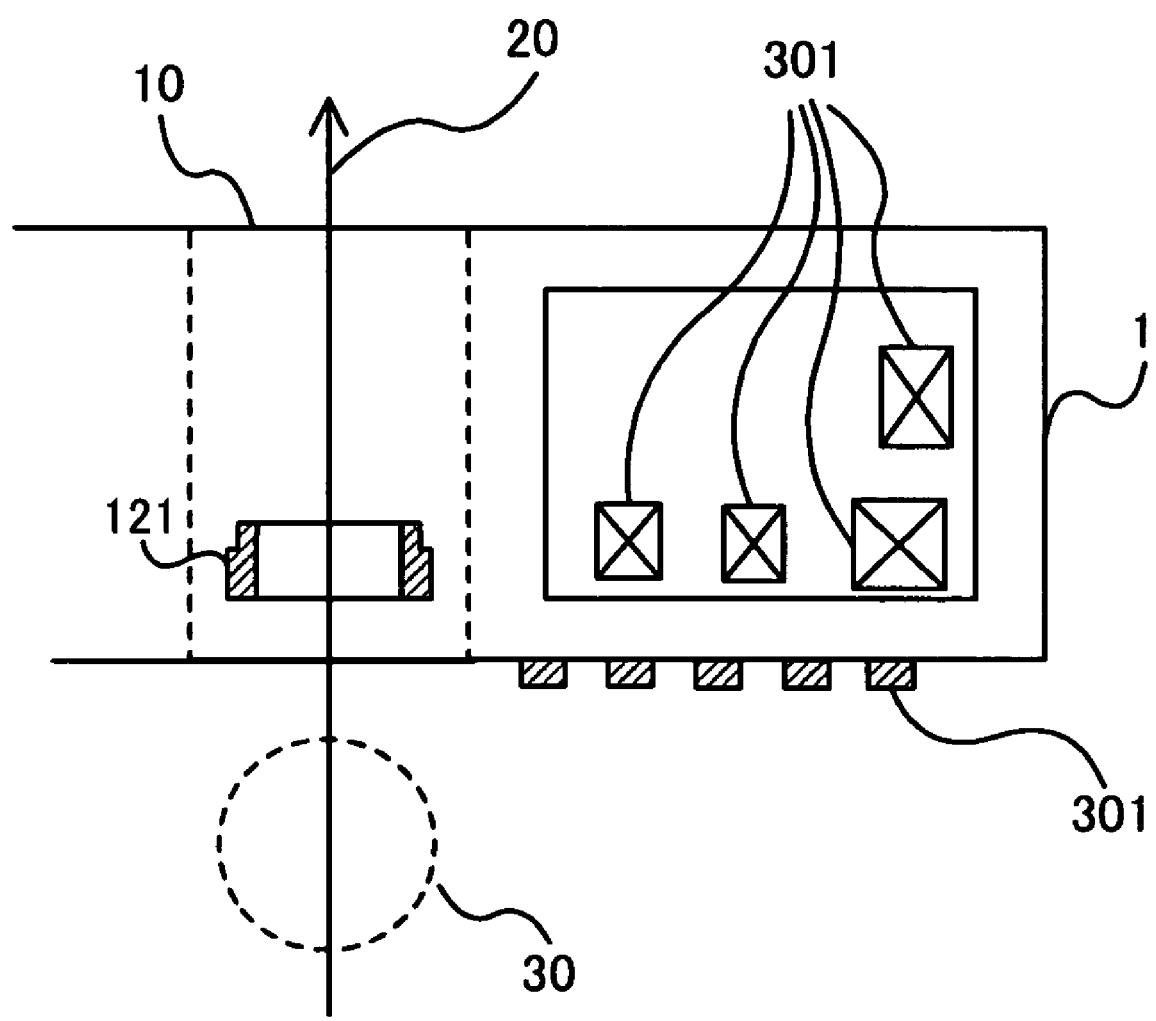
FIG. 5 is a longitudinal cross-sectional view of principal parts of a magnet system according to Embodiment 3.

FIG. 5 is a longitudinal cross-sectional view of principal parts of a magnet system according to Embodiment 3. Embodiment 3 is a variant example in which the shapes of the ring-shaped magnetic shims in Embodiment 1 are changed. What differ from Embodiment 1 will be explained.

In FIG. 5, a ring-shaped magnetic shim 121 is arranged in the cylindrical hollow 10 of the first magnet body 1. The ring-shaped magnetic shim 121 is obtained by making identical the inner diameter of the first ring-shaped magnetic shim 101 and the outer diameter of the second ring-shaped magnetic shim 111. A case is exemplified where the first ring-shaped magnetic shim 101 and the second ring-shaped magnetic shim 111 are configured of a single material; however, they may be configured by making different materials fit into each other.

Moreover, in the ring-shaped magnetic shim 121, the height of the portion corresponding to the first ring-shaped magnetic shim 101 is different from that of the portion corresponding to the second ring-shaped magnetic shim 111. In Embodiment 3, the height of the portion corresponding to the second ring-shaped magnetic shim 111 is larger than that of the portion corresponding to the first ring-shaped magnetic shim 101; however, which portion is higher to what extent, in a specific sense, is appropriately selected in accordance with the extent of correction of the magnetic-field homogeneity.

In addition, although not being illustrated, the same ring-shaped magnetic shim as the ring-shaped magnetic shim 121 is arranged also in the cylindrical hollow 10 of the second magnet body 2. Moreover, a case has been exemplified where both the first ring-shaped magnetic shim 101 and the second ring-shaped magnetic shim 111 are integrated; however, three or more ring-shaped magnetic shims may be integrated.

The properties of the magnetic-field output of a ring-shaped magnetic shim depend also on the height of the ring. By utilizing the ring-shaped magnetic shim 121 illustrated in FIG. 5, the magnetic-field output of a specific Z-direction even order component can be adjusted. In this situation, the ring-shaped magnetic shim 121 has more end faces than a simple cylinder has. The magnetic-field output of a magnetic shim depends on magnetization that appears at an end face; therefore, if, as the ring-shaped magnetic shim 121, the number of end faces increases, it is possible to adjust the magnetic-field output in various ways. Still moreover, by integrating ring-shaped magnetic shims having different diameters, the labor hour for concentrically arranging a plurality of ring-shaped magnetic shims can be omitted.

Embodiment 4

Figure 6:
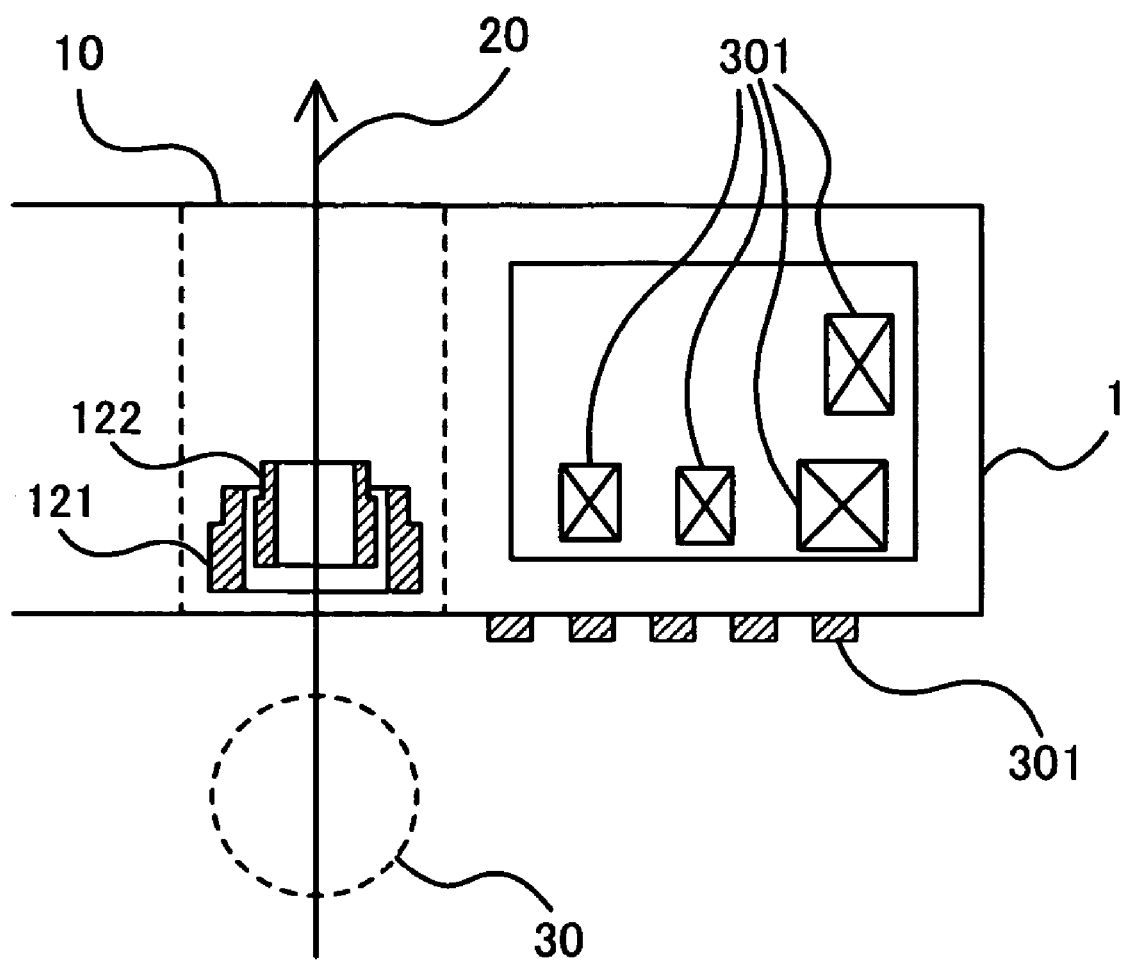
FIG. 6 is a longitudinal cross-sectional view of principal parts of a magnet system according to Embodiment 4.

FIG. 6 is a longitudinal cross-sectional view of principal parts of a magnet system according to Embodiment 4.

Embodiment 4 is a variant example in which the number of the ring-shaped magnetic shims in Embodiment 3 are changed. What differs from Embodiment 3 is that a ring-shaped magnetic shim 122 is arranged inside the ring-shaped magnetic shim 121. As illustrated in FIG. 6, by utilizing the ring-shaped magnetic shims 121 and 122, the magnetic-field outputs of Z-direction even order components can be adjusted in a minute manner.

What is claimed is:

1. A magnet system comprising:
   a first magnet body, having a first cylindrical hollow, in which a first group of superconductive coils are incorporated,
   a second magnet body, having a second cylindrical hollow and being arranged opposing the first magnet body, in which a second group of superconductive coils are incorporated,
   plurality of strip-shaped magnetic shims for adjusting magnetic-field homogeneity of a homogeneous static-magnetic-field space region formed on each of the first magnet body and the second magnet body,
   a first ring-shaped magnetic shim arranged in the first cylindrical hollow of the first magnet body, concentrically with the first group of superconductive coils;
   a second ring-shaped magnetic shim arranged inside the first ring-shaped magnetic shim, concentrically with the first group of superconductive coils;
   a third ring-shaped magnetic shim arranged in the second cylindrical hollow of the second magnet body, concentrically with the second group of superconductive coils and is arranged opposing the first ring-shaped magnetic shim; and
   a fourth ring-shaped magnetic shim arranged inside the third ringshaped magnetic shim, concentrically with the second group of superconductive coils, and arranged opposing the second ring-shaped magnetic shim.

2. The magnet system according to claim 1, wherein, in the homogeneous staticmagnetic-field space region, the tenth-order component in the magnetic-flux direction of the magnetic field created by the first and third ring-shaped magnetic shims is of polarity opposite to that of the tenth-order component in a magnetic-flux direction of a magnetic field created by the second and fourth ring-shaped magnetic shims.

3. The magnet system according to claim 1, wherein the height of the ring of the first ring-shaped magnetic shim differs from that of the ring of the second ring-shaped magnetic shim, the inner diameter of the first ring-shaped magnetic shim is equal to the outer diameter of the second ring-shaped magnetic shim, the height of the ring of the third ring-shaped magnetic shim is equal to that of the ring of the first ring-shaped magnetic shim, the height of the ring of the fourth ring-shaped magnetic shim is equal to that of the ring of the second ring-shaped magnetic shim, and the inner diameter of the third ring-shaped magnetic shim is equal to the outer diameter of the fourth ring-shaped magnetic shim.

4. The magnet system according to claim 3, wherein the first and second ring-shaped magnetic shims are formed of a single material, and the third and fourth ring-shaped magnetic shims are formed of a single material.

5. A magnetic resonance imaging system utilized for in-vivo imaging diagnosis, employing a magnet system comprising:
a first magnet body, having a first cylindrical hollow, in which a first group of superconductive coils are incorporated,
a second magnet body, having a second cylindrical hollow and being arranged opposing the first magnet body, in which a second group of superconductive coils are incorporated,
a plurality of strip-shaped magnetic shims for adjusting magnetic-field homogeneity of a homogeneous static-magnetic-field space region formed on each of the first magnet body and the second magnet body,
a first ring-shaped magnetic shim arranged in the first cylindrical hollow of the first magnet body, concentrically with the first group of superconductive coils;
a second ring-shaped magnetic shim arranged inside the first ring-shaped magnetic shim, concentrically with the first group of superconductive coils;
a third ring-shaped magnetic shim arranged in the second cylindrical hollow of the second magnet body, concentrically with the second group of superconductive coils, and arranged opposing the first ring-shaped magnetic shim; and
a fourth ring-shaped magnetic shim arranged inside the third ring-shaped magnetic shim, concentrically with the second group of superconductive coils, and arranged opposing the second ring-shaped magnetic shim.

6. The magnetic resonance imaging system according to claim 5, wherein, in the homogeneous static-magnetic-field space region in the magnet system, the tenth-order component in the magnetic-flux direction of a magnetic field created by the first and third ring-shaped magnetic shims is of polarity opposite to that of the tenth-order component in the magnetic-flux direction of the magnetic field created by the second and fourth ring-shaped magnetic shims.

7. The magnetic resonance imaging system according to claim 5, wherein, in the magnet system, the height of the ring of the first ring-shaped magnetic shim differs from that of the ring of the second ring-shaped magnetic shim, the inner diameter of the first ring-shaped magnetic shim is equal to the outer diameter of the second ring-shaped magnetic shim, the height of the ring of the third ring-shaped magnetic shim is equal to that of the ring of the first ring-shaped magnetic shim, the height of the ring of the fourth ring-shaped magnetic shim is equal to that of the ring of the second ring-shaped magnetic shim, and the inner diameter of the third ring-shaped magnetic shim is equal to the outer diameter of the fourth ring-shaped magnetic shim.

8. The magnetic resonance imaging system according to claim 7, wherein, in the magnet system, the first and second ring-shaped magnetic shims are formed of a single material, and the third and fourth ring-shaped magnetic shims are formed of a single material.

* * * * *